United States Patent
Morris, Sr.

[11] 4,054,938
[45] Oct. 18, 1977

[54] COMBINED SEMICONDUCTOR DEVICE AND PRINTED CIRCUIT BOARD ASSEMBLY

[75] Inventor: James B. Morris, Sr., San Jose, Calif.

[73] Assignee: American Microsystems, Inc., Santa Clara, Calif.

[21] Appl. No.: 661,539

[22] Filed: Feb. 26, 1976

Related U.S. Application Data

[63] Continuation of Ser. No. 469,460, May 13, 1974, abandoned.

[51] Int. Cl.² .............................................. H05K 1/04
[52] U.S. Cl. ....................................... 361/401; 29/627
[58] Field of Search ............. 317/101 CP; 174/52 PE, 174/52 S; 357/72, 80; 29/625, 626, 627; 361/401

[56] References Cited

U.S. PATENT DOCUMENTS

| | | | |
|---|---|---|---|
| 2,890,395 | 6/1959 | Lathrop et al. | 317/101 A |
| 3,206,647 | 9/1965 | Kahn | 317/101 CP |
| 3,287,795 | 11/1966 | Chambers | 317/101 CP |
| 3,381,071 | 4/1968 | Logan et al. | 317/101 A |
| 3,412,788 | 11/1968 | Pomerantz | 357/72 |
| 3,549,782 | 12/1970 | Reifeu | 174/52 PE |
| 3,622,419 | 11/1971 | London et al. | 317/101 CP |

FOREIGN PATENT DOCUMENTS

| | | | |
|---|---|---|---|
| 1,446,305 | 6/1966 | France | 317/101 CP |
| 1,240,789 | 7/1971 | United Kingdom | 317/101 CP |

*Primary Examiner*—David Smith, Jr.
*Attorney, Agent, or Firm*—Owen, Wickersham & Erickson

[57] ABSTRACT

A method for combining a semiconductor device with a printed circuit board or substrate which eliminates the need for conventional semiconductor packaging and connectors for same on the board and thereby makes possible a relatively small and thin assembly adaptable for space limited electronic products. The semiconductor device is fixed to a carrier which is installed and secured within a hold in the circuit board. Terminal pads of the device are wire bonded to terminals on the substrate, and the connecting wires and die are completely encapsulated within a plastic material.

22 Claims, 6 Drawing Figures

U.S. Patent  Oct. 18, 1977  Sheet 1 of 2  4,054,938
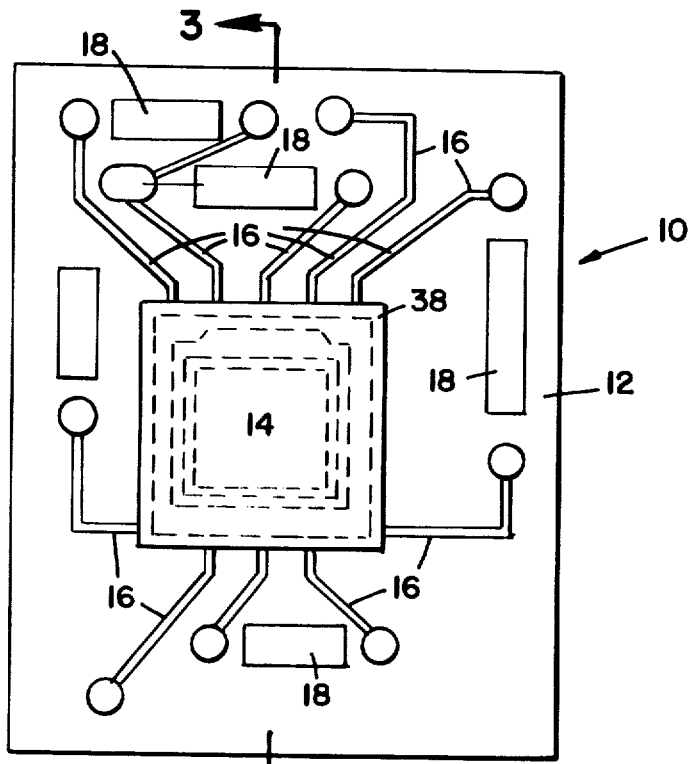
FIG_1
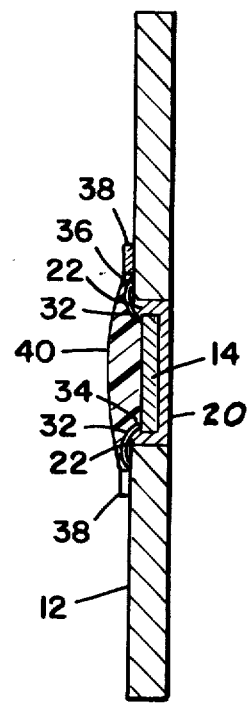
FIG_3
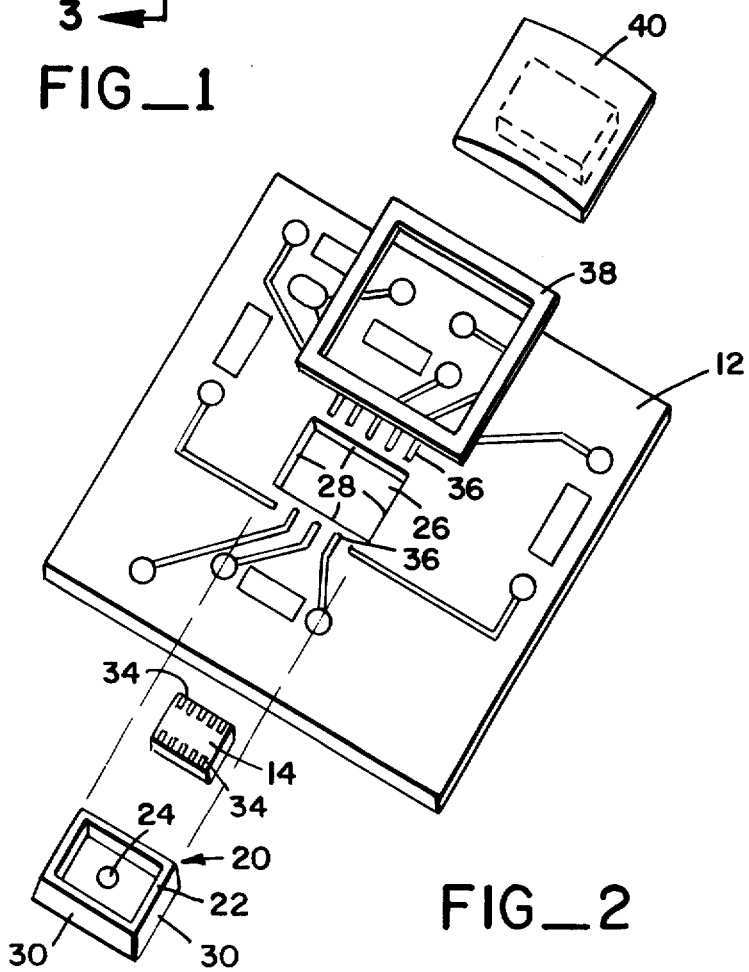
FIG_2

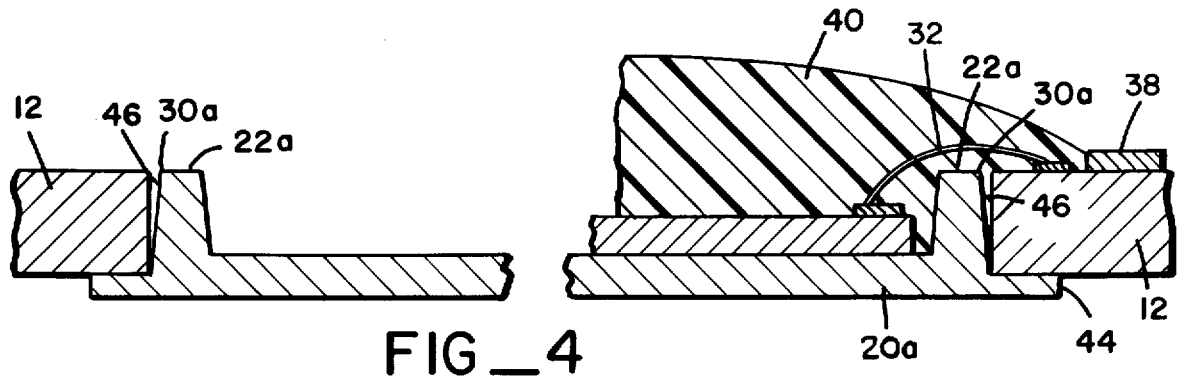
FIG_4
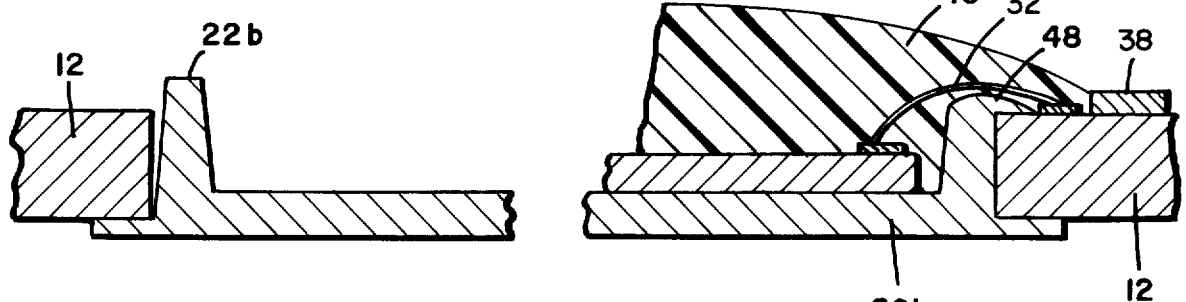
FIG_5
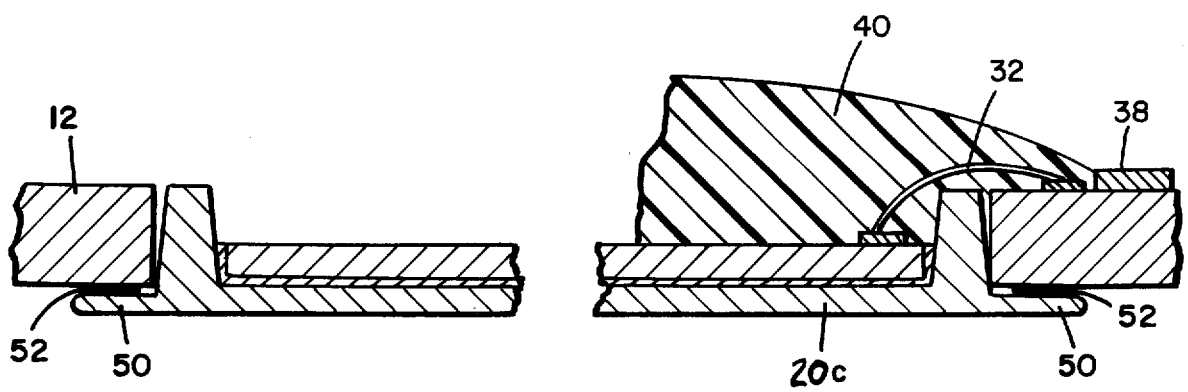
FIG_6

COMBINED SEMICONDUCTOR DEVICE AND PRINTED CIRCUIT BOARD ASSEMBLY

This is a continuation application of U.S. patent application Ser. No. 469,460 filed May 13, 1974, now abandoned.

BACKGROUND OF THE INVENTION

The present invention relates to a method for mounting a semiconductor device directly within a printed circuit board or substrate so that it can be interconnected with its circuitry and components and it also relates to electronic circuit assemblies resulting from the aforesaid method.

A semiconductor device "or die" as it is hereinafter referred to is typically a very small flat chip of crystallized silicon that has been metallurgically and chemically processed into multiple regions of material of varying electrical conductivity. In such an operable semiconductor die, the treated silicon defines one or more microscopic transistors, diodes, resistors and conductors and possibly other circuit elements. A die containing more than one transistor or circuit element is popularly known as an "integrated circuit," and such a semiconductor device or die might contain hundreds or even thousands of separate transistors interconnected into a complete electronic circuit. This large scale integration (LSI) of transistors into a single semiconductor die has made possible such devices as hand held electronic calculators and electronic wrist watches which utilize complex electronic circuits in small packages.

The semiconductor die itself is characteristically small in size, with dimensions typically on the order of not more than one eighth of an inch by one eighth of an inch square by fifteen thousandths of an inch thick. Despite their small size, these dies in accordance with the prior art, were typically packaged in the supporting structures many times the size of the semiconductors. Such prior art structures for semiconductor devices have been formed in a variety of sizes and shapes but commonly fall into three basic shapes: cylindrical metal cans with wire connection pins extending from the bottom thereof, flat packages with strip connectors extending from the edges, and ceramic or plastic in line packages with metal prongs extending out of opposite edges and bent over to form a unit suitable for plugging into a socket, or directly into a printed circuit substrate. Regardless of the particular package utilized for prior art semiconductor structures, a primary drawback with them was their large space requirements and the cost of the separate packaging. The space requirement factor became particularly limiting in the design of miniature electronic devices such as hand calculators and wrist watches which required increasingly smaller physical packages.

Another drawback of the prior art discrete or intermediate semiconductor packages was the multiple electrical connections required. In attaching such a semiconductor device to a circuit each separate circuit path required three separate joints or connection. First, a very small metallic bonding wire of about one thousandths of an inch in diameter was bonded to a metalized pad on the die either by ultrasonic or thermocompression bonding techniques. The other end of the very small wire was likewise bonded to a package bonding pad connected to an external package lead. The package leads were then connectible to a package receptable mounted on the printed circuit board of the main assembly. The multiple connections required for each conductor in prior art discrete packages resulted in a less than satisfactory connection reliability rate in such packages.

SUMMARY OF THE INVENTION

One important object of the present invention is to provide a method for supporting a semiconductor device within printed board and interconnecting it directly to circuitry of the board or substrate that eliminates the need for conventional intermediate packaging and overcomes the problems of the prior art.

A closely related object of the present invention is to provide a method which significantly reduces the space heretofore required for semiconductor devices within the physical layout of a printed circuit.

Another object of the present invention is to provide a method which reduces the number of separate operations heretofore required for interconnecting an operable semiconductor device with a printed circuit board.

A further object of the present invention is to reduce significantly the amount of material required to package semiconductor devices.

Yet another object of the present invention is to provide an assembly comprising a semiconductor device and a printed circuit board that can be relatively small, thin and compact, has reliable interconnections that are fully encapsulated, that is particularly well adapted for ease and economy of manufacture and readily adaptable to products having severe space limitations.

The semiconductor assembly of the present invention is characterized by a complete integration of a semiconductor die into a printed circuit substrate including the electrical connection between the die and the circuit substrate terminals or its electrical or electronic discrete components. An important element of the assembly is a small flat die carrier which fits within a preformed hole in the substrate. The top surface of the carrier has a continuous wall along its edge which is sized to surround the die so that the die will nest entirely within the carrier where it is secured by adhesive means. In most applications the die carrier may be formed out a plastic or resin material, but where it is necessary to conduct heat generated in the die to external dissipation means, it may be formed from a suitable heat conductive metal with the die being mounted therein by means of thermal solder. The carrier containing the die is then itself nested into the preformed substrate hole which is sized to receive the carrier. Thus, the carrier and its die is retained within the substrate hole either by friction between the interior edges of the substrate contacting the exterior edges of the carrier, or by a small lip aound the bottom of the carrier, or by fusing or otherwise bonding the carrier to the substrate.

After the carrier is mounted within the substrate, electrical connections are made using conventional wire bonding techniques with fine wires directly between the metalized connection pads on the die and corresponding connection pads on the substrate. After all such connections are completed, the semiconductor and substrate are normally subjected to functional testing using conventional circuit testing equipment. Once testing is completed, an encapsulation material dam forming a continuous wall structure is placed into contact with the substrate surface in a position surrounding the die and the connecting wires. Liquid encapsulation material is then poured into the space within the dam in a quantity sufficient to encapsulate completely the die, the exposed surfaces of the carrier, all connecting wires, the inner edges of the dam and the top of the substrate therewithin. This encapsulation also serves to further lock the carrier firmly into the substrate. Once the carrier is fully installed, other circuit components can then be added to complete the substrate assembly.

Other objects, advantages and features of the invention will become apparent from the following detailed description of the embodiment, presented with the accompanying drawing.

BRIEF DESCRIPTION OF THE DRAWINGS

FIG. 1 is a plan view of assembly embodying the principles of the present invention comprising a semiconductor device directly packaged within a printed circuit substrate having other discrete electrical components;

FIG. 2 is an exploded view in perspective of the assembly of FIG. 1;

FIG. 3 is a view in elevation and in section taken along line 3—3 of FIG. 1;

FIG. 4 is an enlarged fragmentary view in elevation and in section showing one form of carrier for the semiconductor device of the assembly with the broken portion on the right hand side of the view showing the assembly after the encapsulation in in place;

FIG. 5 is an enlarged fragmentary view in elevation similar to FIG. 4 showing an alternate form of semiconductor carrier for an assembly according to the invention; and FIG. 6 is a view similar to FIGS. 4 and 5 showing yet another form of semiconductor carrier fixed to a circuit substrate according to the invention.

DESCRIPTION OF THE PREFERRED EMBODIMENT

With reference to the drawing, FIG. 1 shows an electronic assembly 10 embodying the principles of the present invention which may be adaptable for use in a wide variety of electronic controlled devices such as time keeping devices, calculators or the like. Generally, the assembly comprises a printed circuit board or substrate 12 with a semiconductor die or device 14 that is secured to it and connected directly to circuit terminals on the substrate. The circuit board may have any preselected pattern of surface conductive paths 16, some of which may be connected to other components of a typical circuit board assembly, as indicated by the numeral 18. FIG. 2 shows an exploded view of the assembly components. The semiconductor die 14 is mounted in a generally flat die carrier 20 having walls 22 surrounding the edges of the die so that the die fits closely within the carrier. The carrier may be formed from a plastic or resin material, although for certain types of integrated circuit semiconductor devices it is preferable to form the carrier from a conductive metal material which has better heat dissipation characteristics and can be used as a ground connection. A small drop of nonconductive, hard curing cement 24 is placed on the top surface of carrier 20 within its walls to bond the die 14 to the carrier.

The printed circuit substrate 12 has a hole 26 spaced inwardly from its edges that is sized and shaped to receive the carrier 20 in a close fitting engagement. In the embodiment shown, the hole and carrier are both rectangular and the hole 26 is defined by four interior edges 28 which are engaged by exterior wall surfaces 30 of the carrier, secured therein by a press fit with the bottom surface of the carrier being substantially flush with the surrounding substrate surface. As shown in FIG. 3, wire conductors 32 are bonded to metallized connections pads 34 on the die 14 and extend over the carrier walls 22 to corresponding connection pads 36 that surround the hole on the printed circuit substrate.

An encapsulation material dam 38 having a structure of a four sided enclosure wall is placed in contacting engagement with the top surface of the substrate 12 so as to completely enclose that portion of the top surface of the substrate in which the carrier 20 is mounted as well as the substrate connection pads 36. The dam 38 may be made as a preform of thin nonconductive material which is bonded to the substrate. However, I have found that this dam can also be formed effectively by a coating applied directly to the substrate surface to a thickness or height in the range of 0.0003–0.001 inches and a width of around 0.025–0.040 inches, using either a silk screen or a thick film screen process. When applied in the latter manner the dam material should be a non-wetting agent with respect to the substrate material. Thus, where the substrate comprises an epoxy, as commonly used on printed circuit boards, I have found that a dam formed of a plating resist material provides excellent results. When this dam of plating resist is contacted by an epoxy type encapsulation material 40 it contracts slightly due to the chemical reaction of the two materials and forms a dinstinctive hardened edge around the encapsulation that provides a barrier for it.

The initially liquid encapsulation material 40 is poured into the space within the confines of the dam in sufficient quantity to envelope entirely the exposed surfaces of die 14, the exposed edges of carrier 20, all connection wires 32 and the surface of substrate 12 within the dam 38. The encapsulation material 40 is adherent to the die 14, the carrier 20 and the substrate 12 and may be an epoxy material similar to the cement material 24. After the encapsulation material is poured into place within the dam it is permitted to get and harden to hereby securely bond the die 14 and the carrier 20 to substrate 12, as well as encapsulating the die and its connection wires 32 directly into the substrate.

An alternate encapsulation material 40 to the aforementioned epoxy type which may be used in the present invention is a hot melt thermoplastic material. In using such material it is first heated to its melting temperature and then poured into the space within the dam 38 in the same manner and to the same extent as the epoxy material. The assembly 10 is then cooled to solidify the thermoplastic material.

The carrier 30 for the semiconductor device 14 may be modified, if desired, to increase the ease of installing and securing it into the substrate. FIG. 4 illustrates a cross sectional view of an alternative die carrier 20a having a continuous lip 44 extending outwardly and horizontally along its bottom exterior edge. This lip serves as a stop which limits the upward projection of the carrier within substrate 12. The outer surfaces 30a of the carrier wall 22a are tapered slightly so that a narrow cavity 46 is formed between these surfaces and the edges of the substrate opening. The thickness of the substrate may vary, but generally it is equal to or somewhat less than the height of the carrier walls. As shown in the right-hand side of FIG. 4, this cavity 46 is filled with encapsulation 40 to help hold the carrier within the substrate in the finished product.

FIG. 5 illustrates a cross sectional view of another die carrier 20b similar to that of FIG. 4 but having walls 22b that initially extend somewhat higher about the top surface of substrate 12. After carrier 20b has been nested into its substrate, the top parts 48 of its walls are deformed by being bent outwardly over the substrate surface, thereby forming a locking lip which secures the carrier 20b to its substrate. This locking lip is also covered by the encapsulation 40 as shown in the right-hand side of FIG. 5.

Another die carrier 20c, as shown in cross section in FIG. 6, illustrates an additional means for securing a carrier to a substrate according to the present invention. Here, the carrier 20c is provided with a lip or flange 50 that extends outwardly from the bottom of the carrier somewhat more than does the flange 44 in the carrier 20a of FIG. 4. Between this extended lip and the bottom surface of the substrate is an adhesive material 52, preferably a preform of bonding material. By use of pressure and heat, the adhesive preform material bonds the top of the lip or flange 50 to the adjacent bottom surface of the substrate, thereby securing the carrier 20c to it.

From the foregoing it should be apparent that the present invention provides a unique solution to the problem of combining a semiconductor device with a printed circuit board to form an assembly or sub-assembly that can be extremely small, compact and slim and thus particularly adaptable to relatively small microelectronic devices such as wrist watches or small calculators. Moreover, the method provided by the invention enables the assembly to be constructed with a low cost in labor and materials and yet with a high degree of production yield and reliability.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. Method of constructing a thin unitized electronic circuit by securing a large scale integrated circuit semiconductor die having a plurality of terminal pads spaced apart along the edges of a top major surface thereof within a hole in a thin and flat printed circuit board and connecting said die terminal pads to spaced apart connection pads on a top major surface of said board positioned adjacently surrounding said opening comprising the sequence of:
    a. providing a thin and flat die carrier with an external thickness closely approximating the thickness of said board and with peripheral walls surrounding a flat base thereby defining a rectangular well within said carrier which is sized so that said die fits snugly therewithin with a bottom major surface thereof oppositely adjacent said flat base; then
    b. attaching said semiconductor die to said die carrier entirely within said well by bonding said bottom major surface to said base; and then
    c. placing said die carrier containing said die into said hold in said printed circuit board which has been preformed and sized to receive said die carrier substantially entirely therewithin; then
    d. electrically interconnecting said terminal pads of said die and connection pads of said board with fine wires which pass adjacently across the tops of said peripheral walls; and then
    e. covering completely said die, the exposed surfaces of said carrier, said fine wires and the portion of said board adjacently surrounding said hole with hardcuring liquid encapsulation material.

2. The method as set forth in claim 1 including just prior to said covering step the further step of forming a dam on the upper surface of said board around said hole for confining said encapsulation material to an area of said board surrounding said die carrier and spaced outwardly from said hole so as to also surround said connection pads.

3. The method as set forth in claim 1 including the steps of initially retaining said die carrier within said hole by an interference fit and thereafter by covering thereof with said encapsulation material.

4. The method as set forth in claim 1 including the step of bending over a tip portion of the carrier peripheral walls to engage the top major surface of said board surrounding said hole before said encapsulation material covers said carrier and said wires and the portion of said board adjacently surrounding said hole.

5. The method as set forth in claim 1 including providing the carrier with an outwardly extending flange near its bottom edge, and bonding said flange to the bottom surface of said substrate around said hole.

6. The method as set forth in claim 2 wherein said encapsulation material is a liquid epoxy and is filled up to the level of said dam, and allowing said epoxy to cure to form a protective case around the die, the carrier and said interconnecting wires between said terminal pads and said connection pads.

7. The method as set forth in claim 2 wherein said dam is formed on said board from a plating resist material applied to said substrate by a screening process.

8. A flat and thin unitary electronic assembly for use in electronically controlled apparatus comprising in combination:
    a. a flat and thin printed circuit substrate having conductive paths and connected components on at least one major surface thereof and originally formed with a transverse opening with connection pads of at least some of said paths spaced around the entire extent of said opening;
    b. a die carrier sized and shaped to fit substantially entirely within and occupy said substrate opening and permanently secured therein, said carrier having a continuous peripheral wall portion forming a shallow recess in a major surface of said carrier;
    c. a semiconductor die permanently attached to said carrier entirely within said recess and having a flat top surface processed to define a microelectronic circuit with electrical terminal pads spaced around the entire extent of the periphery of the top surface of said die, a flat bottom surface generally parallel to said top surface and a transverse thickness much smaller than the length or width of its top surface;
    d. electrical connection wires for directly interconnecting said terminal pads of said die to predetermined corresponding connection pads on said substrate; and
    e. cured encapsulation means enveloping said die, the exposed recessed portion of said die carrier, and said electrical connection wires.

9. The assembly as described in claim 8 including dam means surrounding said transverse opening in substrate and forming a wall for containing said encapsulation means and confining it to an area of said substrate closely surrounding said die carrier and said electrical connection means.

10. The assembly as described in claim 8 including flange means extending from the bottom edge of said die carrier and means bonding said flange means to the bottom surface of said substrate.

11. The assembly as described in claim 8 including bent over portions along the top edge of said peripheral wall on said die carrier and fully covered by said encapsulation.

12. The assembly as described in claim 8 wherein said die carrier is a metallic material.

13. The assembly as described in claim 8 wherein said dam means is a plating resist material and said encapsulation means is an epoxy material which reacts somewhat with said plating resist material to form a hardened barrier edge.

14. The assembly as described in claim 8 wherein said substrate, said die carrier and said encapsulation means comprise an epoxy material.

15. The assembly as described in claim 8 wherein said die carrier and said encapsulation means comprise hardcured plastic material.

16. Method of constructing a thin unitized electronic circuit by securing and connecting a large scale integrated circuit semiconductor die within and to a thin and flat printed circuit board carrying interconnected other components of said electronic circuit comprising the sequence of
    a. attaching said semiconductor die within a relatively flat die carrier that is larger than the die and structured to receive the die within a recess formed by a walled portion of the carrier extending along the edges thereof, said carrier being provided with an outwardly extending flange near its bottom edge; and then
    b. placing said die carrier containing said die into a hole of said printed circuit board which has been preformed and sized to receive said die carrier substantially entirely therewithin, and bonding said flange to a bottom surface of said board adjacent to said hold; then
    c. electrically interconnecting terminal pads of said die to corresponding printed circuit terminal pads on a top surface of said board adjacent to said hole; and then
    d. covering completely said die, the exposed wall portion and recess surface of said carrier and portions of said board adjacently surrounding said hole including terminal pads of both said die and said board with hardcuring liquid encapsulation material.

17. The method as set forth in claim 16 including the further step of forming a dam on the upper surface of said board around said hole for confining said encapsulation material to an area of said substrate surrounding said die carrier and spaced outwardly from said hole so as to surround also said terminal pads.

18. The method as set forth in claim 16 including the step of swaging a tip portion of the die carrier walled portion to engage a portion of said top surface of said board adjacent said hole after placing said die carrier therewithin.

19. The method as set forth in claim 17 wherein said dam is formed on said substrate from a plating resist material applied to said substrate by a screening process.

20. A flat and thin unitary electronic assembly for use in electronically controlled apparatus comprising in combination:
    a. a flat and thin printed circuit substrate having conductive paths and connected components on at least one major surface thereof and originally formed with a transverse opening with connection pads of at least some of said paths spaced around said opening;
    b. a die carrier sized and shaped to fit substantially entirely within and occupy said substrate opening and permanently secured therein, said carrier having an peripheral wall portion forming a shallow recess in a major surface of said carrier, said carrier including flange means extending from the bottom edge thereof and means bonding said flange means to the adjacent major surface of said substrate;
    c. a semiconductor die permanently attached to said carrier entirely within said recess and having a flat top surface processed to define a microelectronic circuit with electrical terminal pads, a flat bottom surface generally parallel to said top surface and a transverse thickness much smaller than the length or width of its top surface;
    d. electrical connection means for directly interconnecting said terminal pads of said die to predetermined corresponding connection pads on said substrate and
    e. cured encapsulation means enveloping said die, the exposed recess portions of said die carrier and said electrical connection means.

21. The assembly as described in claim 20 including bent over portions along the top edge of said peripheral wall on said die carrier and fully covered by said encapsulation means.

22. The assembly as described in claim 20 wherein said electrical connection means are wires bonded to terminal pads on said die and extending over said peripheral wall portion of said carrier to said connection pads on said substrate.

* * * * *